(12) United States Patent
Lutz et al.

(10) Patent No.: US 10,488,470 B2
(45) Date of Patent: Nov. 26, 2019

(54) METHOD FOR MEASURING AN ELECTRICAL CURRENT AND CURRENT SENSOR

(71) Applicant: Robert Bosch GmbH, Stuttgart (DE)

(72) Inventors: Theresa Lutz, Ottobrunn (DE); Frank Schatz, Kornwestheim (DE); Robert Roelver, Calw-Stammheim (DE)

(73) Assignee: Robert Bosch GmbH, Stuttgart (DE)

( * ) Notice: Subject to any disclaimer, the term of this patent is extended or adjusted under 35 U.S.C. 154(b) by 92 days.

(21) Appl. No.: 15/571,357

(22) PCT Filed: Mar. 8, 2016

(86) PCT No.: PCT/EP2016/054872
§ 371 (c)(1),
(2) Date: Nov. 2, 2017

(87) PCT Pub. No.: WO2016/177490
PCT Pub. Date: Nov. 10, 2016

(65) Prior Publication Data
US 2019/0154766 A1    May 23, 2019

(30) Foreign Application Priority Data

May 4, 2015  (DE) .................. 10 2015 208 151

(51) Int. Cl.
*G01R 33/032* (2006.01)
*G01R 33/12* (2006.01)
*G01R 15/24* (2006.01)

(52) U.S. Cl.
CPC ......... *G01R 33/032* (2013.01); *G01R 15/245* (2013.01); *G01R 33/12* (2013.01); *G01R 33/1284* (2013.01)

(58) Field of Classification Search
CPC ..... G01R 33/032; G01R 15/245; G01R 33/12
(Continued)

(56) References Cited

U.S. PATENT DOCUMENTS

2011/0120890 A1  5/2011  MacPherson et al.
2015/0001422 A1*  1/2015  Englund ............ G01N 21/6458
                                                          250/459.1
(Continued)

FOREIGN PATENT DOCUMENTS

WO   2013188732 A1   12/2013
WO   2015107907 A1    7/2015

OTHER PUBLICATIONS

International Search Report corresponding to PCT Application No. PCT/EP2016/054872, dated May 19, 2016 (German and English language document) (7 pages).

*Primary Examiner* — Melissa J Koval
*Assistant Examiner* — Trung Nguyen
(74) *Attorney, Agent, or Firm* — Maginot, Moore & Beck LLP

(57) ABSTRACT

The disclosure relates to a method for measuring a current using a diamond material. The diamond material has at least one nitrogen deposit and an imperfection in a crystal lattice of the diamond material, adjacent to the nitrogen deposit. The method comprises a providing step, a detecting step and an evaluating step. In the providing step, electromagnetic waves are provided to excite the diamond material. In the evaluating step, an intensity of a fluorescence of the diamond material is detected. In the evaluating step, the intensity and a frequency of the electromagnetic waves are evaluated in order to determine a magnetic field strength influencing the fluorescence.

9 Claims, 9 Drawing Sheets

(58) Field of Classification Search
USPC ................ 324/600, 713, 500–521, 522, 718, 324/115–124, 76.11, 200, 207.13–245, 324/529–530, 750.23, 754.23
See application file for complete search history.

(56) References Cited

U.S. PATENT DOCUMENTS

| | | |
|---|---|---|
| 2015/0090033 A1 | 4/2015 | Budker et al. |
| 2016/0146904 A1* | 5/2016 | Stetson, Jr. .......... G01R 33/032 324/202 |

* cited by examiner

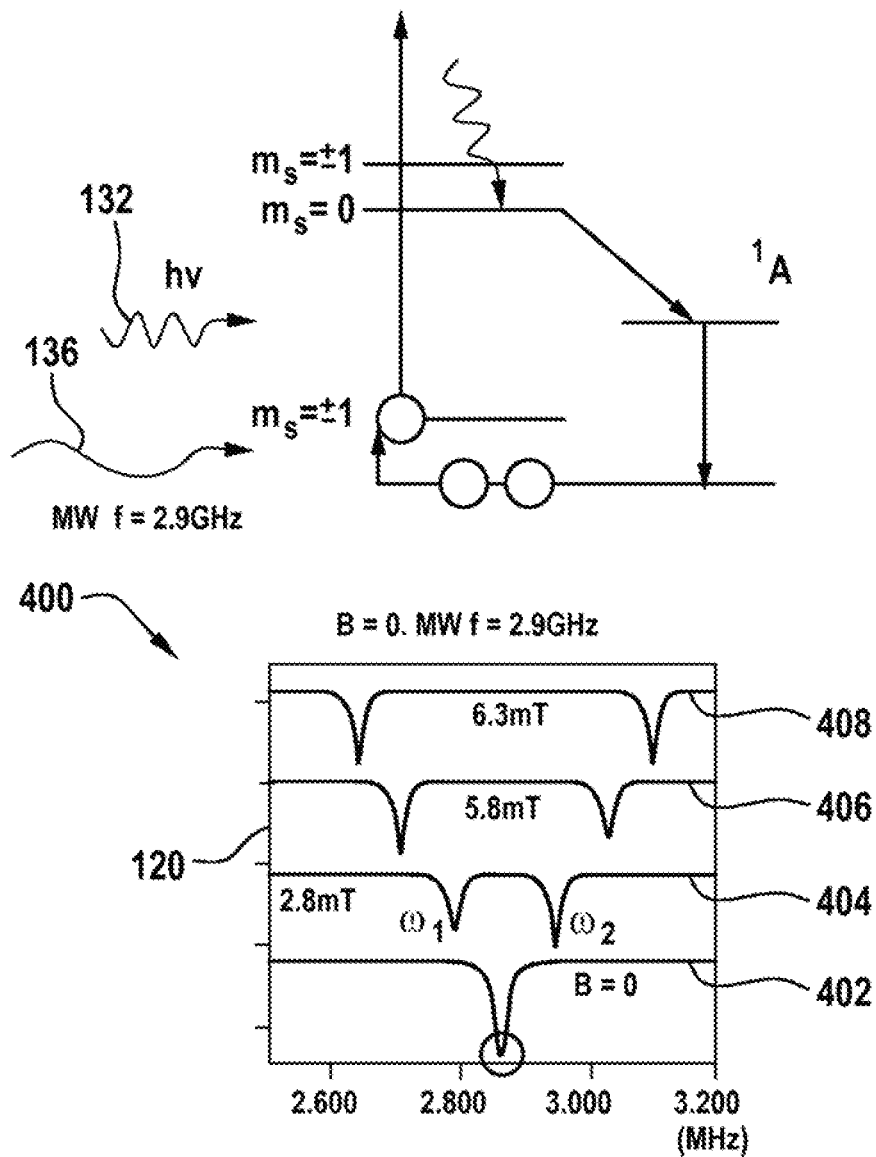

Fig. 4c
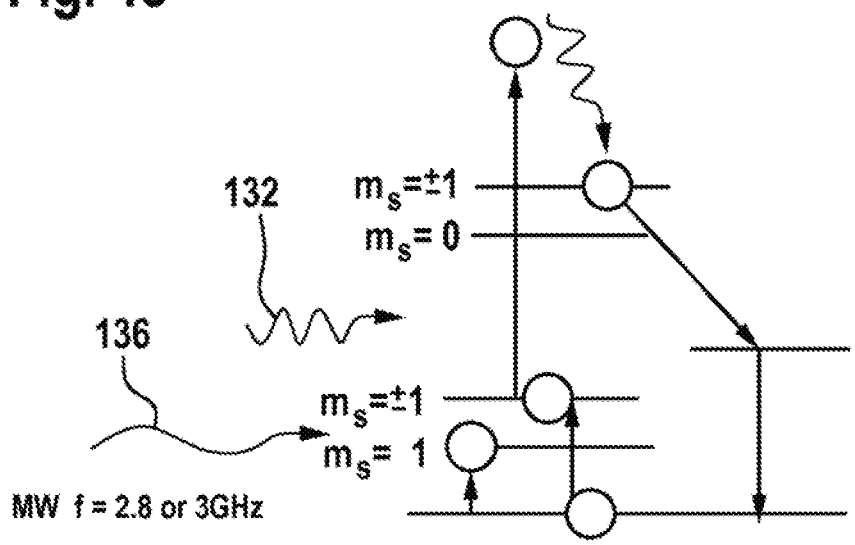
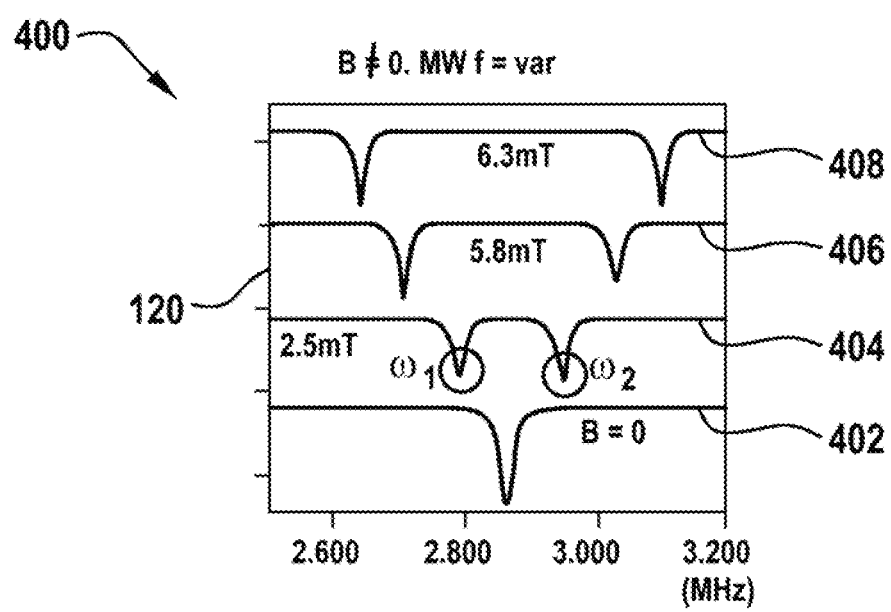

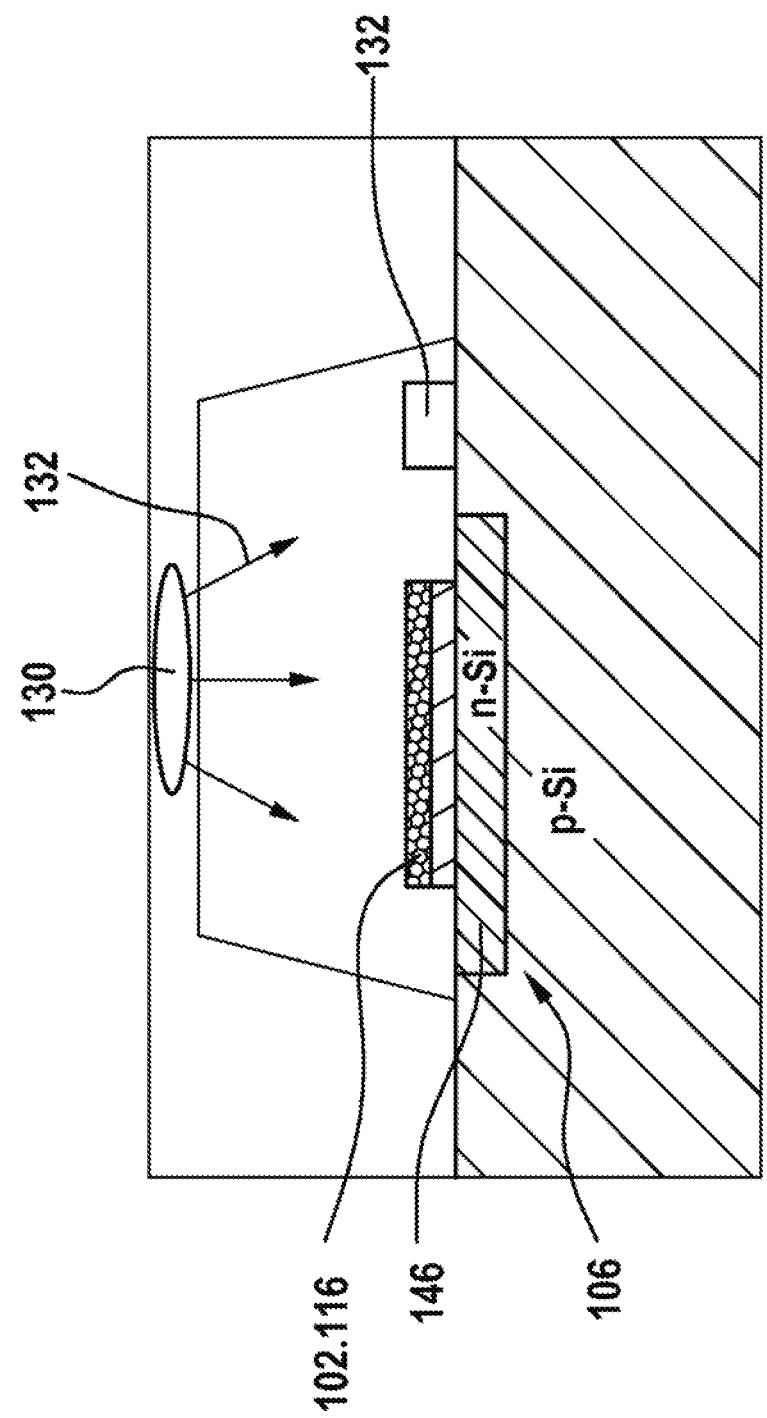

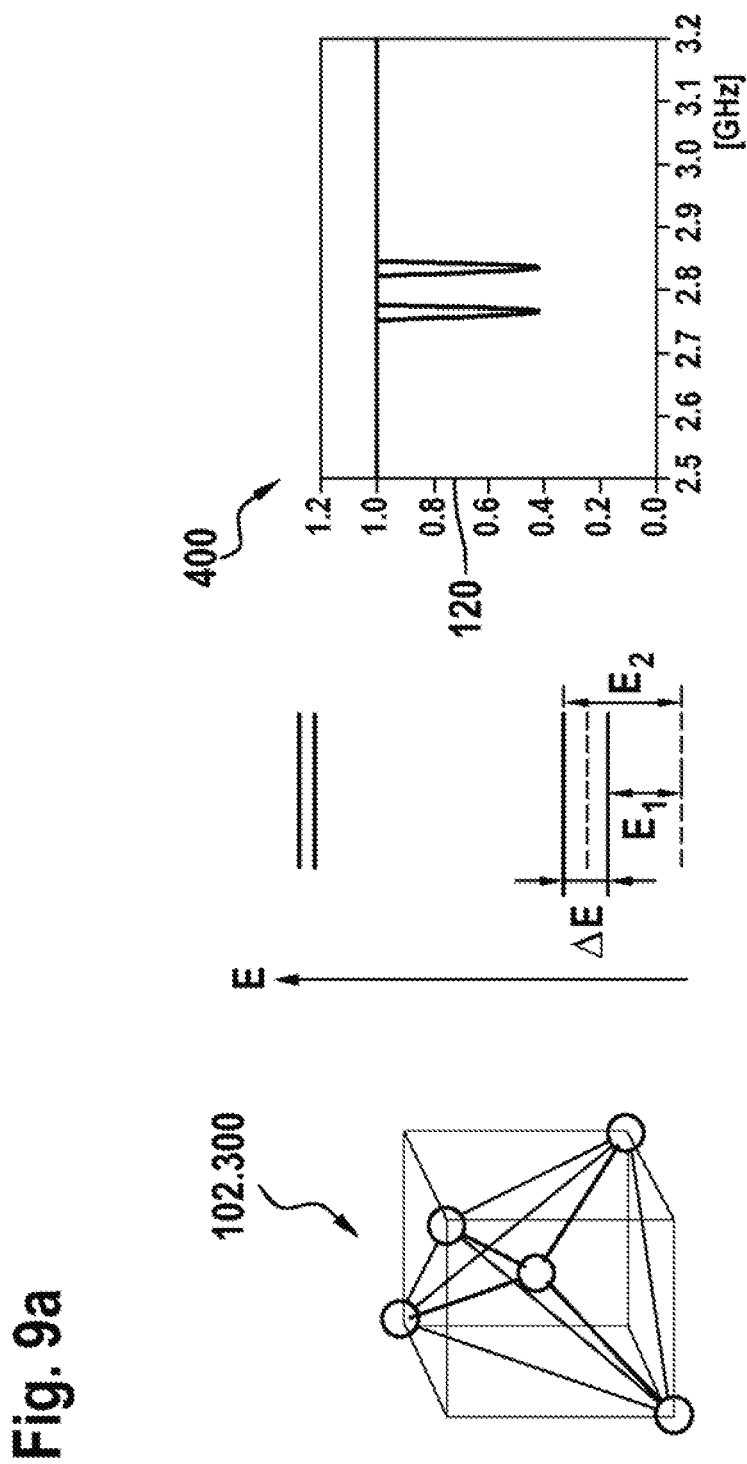

METHOD FOR MEASURING AN ELECTRICAL CURRENT AND CURRENT SENSOR

This application is a 35 U.S.C. § 371 National Stage Application of PCT/EP2016/054872, filed on Mar. 8, 2016, which claims the benefit of priority to Ser. No. DE 10 2015 208 151.6, filed on May 4, 2015 in Germany, the disclosures of which are incorporated herein by reference in their entirety.

BACKGROUND

The present disclosure relates to a method for measuring an electric current, a corresponding current sensor, and a corresponding computer program.

Today, approaches such as measuring the voltage drop at a shunt resistor, or measuring current-induced magnetic fields via Hall sensors and magnetic field sensors based on the tunneling magnetoresistance or the giant magnetoresistance effect (TMR and GMR sensors), are already available for measuring electric currents.

SUMMARY

Against this background, using the approach provided here, a method for measuring an electric current, using a diamond material, furthermore, a current sensor including a diamond material, and finally, a corresponding computer program, are provided. Advantageous embodiments result the following description.

An electric current in an electrical conductor induces a magnetic field around the conductor. A nitrogen-vacancy center in a diamond crystal is highly sensitive to the magnetic field due to the Zeemann effect. The nitrogen-vacancy center may be read out optically having a large value range, whereby the current flow may be determined with high accuracy.

A method is provided for measuring an electric current producing a magnetic field, using a diamond material which can be exposed to the magnetic field, wherein the diamond material has at least one nitrogen intercalation and a vacancy in a crystal lattice of the diamond material which is adjacent to the nitrogen intercalation, wherein the method includes the following steps:

providing first electromagnetic waves in a first frequency spectrum and second electromagnetic waves in a second frequency spectrum, in order to excite the diamond material to fluorescence;

detecting a fluorescence intensity of the fluorescence;

evaluating the intensity and a frequency of the second electromagnetic waves, in order to ascertain a magnetic field strength of the magnetic material influencing the fluorescence; and determining a current intensity of the current, using the magnetic field strength.

A diamond material may be understood to mean diamond having at least one nitrogen-vacancy center. A nitrogen-vacancy center may be a nitrogen intercalation into a crystal lattice of the diamond and a vacancy in the crystal lattice which is adjacent to the nitrogen intercalation. The nitrogen-vacancy center has a sensitivity to a magnetic field, for example, emanating from a current-carrying conductor. At least one excitation frequency associated with a local minimum of a fluorescence or a fluorescence spectrum of the diamond material shifts proportionally to a magnetic field strength of the magnetic field. The magnetic field strength may easily be converted into the inducing current intensity, for example, using a predetermined processing specification. A simple evaluation may, for example, be carried out via threshold value monitoring of the fluorescence intensity. In this case, the first electromagnetic waves may be provided having a constant frequency and the second electromagnetic waves may be provided having a variable frequency. By falling below the threshold value, the location of the intensity minima which are characteristic for a magnetic field having a particular field strength is obtained directly.

In the step of evaluating, a first local intensity minimum of the fluorescence at a first frequency of the second electromagnetic waves may be evaluated. Furthermore, a second local intensity minimum of the fluorescence at a second frequency of the second electromagnetic waves may be evaluated. The field strength may be ascertained using a frequency spacing between the frequencies. Under constant environmental conditions, the first frequency and the second frequency change approximately linearly with respect to a change in the magnetic field.

In the step of providing, the second electromagnetic waves may be irradiated as a frequency profile. In the step of detecting, an intensity profile of the fluorescence may be detected. In the step of evaluating, the field strength may be ascertained using a relationship between the frequency profile and the intensity profile. The diamond material may be excited at a variable excitation frequency by the second electromagnetic waves. In particular, a predetermined frequency range may be completely spanned. As a result, the at least one fluorescence minimum may be detected in a simple manner.

The diamond material may be excited by means of light as first electromagnetic waves and by means of microwave energy as second electromagnetic waves. In particular, the diamond material may be simultaneously excited by means of light and microwave energy. In this case, the light may be provided having a constant wavelength, while the microwave energy may be provided having variable frequencies. As a result, the magnetic field may be measured particularly well.

In the step of providing, furthermore, a reference magnetic field having a reference field strength and a reference field direction may be provided. In the step of evaluating, the magnetic field strength and direction of the field to be measured may be ascertained by comparing the fluorescence spectrum in the magnetic field-free case and the fluorescence spectrum recorded under the influence of the magnetic field to be measured. By means of this comparison, for example, interference fields from other directions may be differentiated from the magnetic field to be measured of a current-carrying conductor.

The method may include a step of optically filtering the emission of the diamond material, in order to filter out the fluorescence of the diamond material from the scattered light, for example, from the optical excitation of the fluorescence, thereby making it possible to increase measuring accuracy.

In the step of evaluating, furthermore, a temperature of the diamond material may be ascertained by evaluating the frequencies, for example, recorded via threshold value detection. The frequency or frequencies via which the magnetic field is ascertained shift as a function of temperature. As a result, the temperature may be derived directly from the temperature dependent frequency shifts of the local minima.

Furthermore, a current sensor for measuring an electric current producing a magnetic field is provided, wherein the current sensor has the following features:

a diamond material which can be exposed to the magnetic field, and which has at least one nitrogen intercalation and a vacancy in the crystal lattice of the diamond material which is adjacent to the nitrogen intercalation;

an emitter for providing first electromagnetic waves in a first frequency spectrum and second electromagnetic waves in a second frequency spectrum, in order to excite the diamond material to fluorescence;

a sensor for detecting a fluorescence intensity of a fluorescence;

an evaluating device for ascertaining a field strength of the magnetic field, using the fluorescence intensity and a frequency of the second electromagnetic waves; and a determining device for determining a current intensity of the current, using the magnetic field strength.

Also advantageous is a computer program product or computer program including program code which may be stored on a machine-readable medium or storage medium such as a semiconductor memory, a hard-disk memory, or an optical memory, and which is used for carrying out, implementing, and/or controlling the steps of the method according to one of the previously described embodiments, in particular if the program product or program is executed on a computer or a device.

BRIEF DESCRIPTION OF THE DRAWINGS

The approach provided here will be described in greater detail below based on the appended drawings. The following are shown:

FIGS. 4a, 4b, 4c show a functionality and energy diagram of the current measurement via fluorescence measurement in the case of additional microwave excitation, according to one exemplary embodiment of the present disclosure;

FIG. 7 shows a depiction of a current sensor, according to one exemplary embodiment of the present disclosure;

FIGS. 9a, 9b show a functionality and energy diagram of the temperature measurement via fluorescence measurement in the case of additional microwave excitation, according to one exemplary embodiment of the present disclosure.

DETAILED DESCRIPTION

Figure 1:
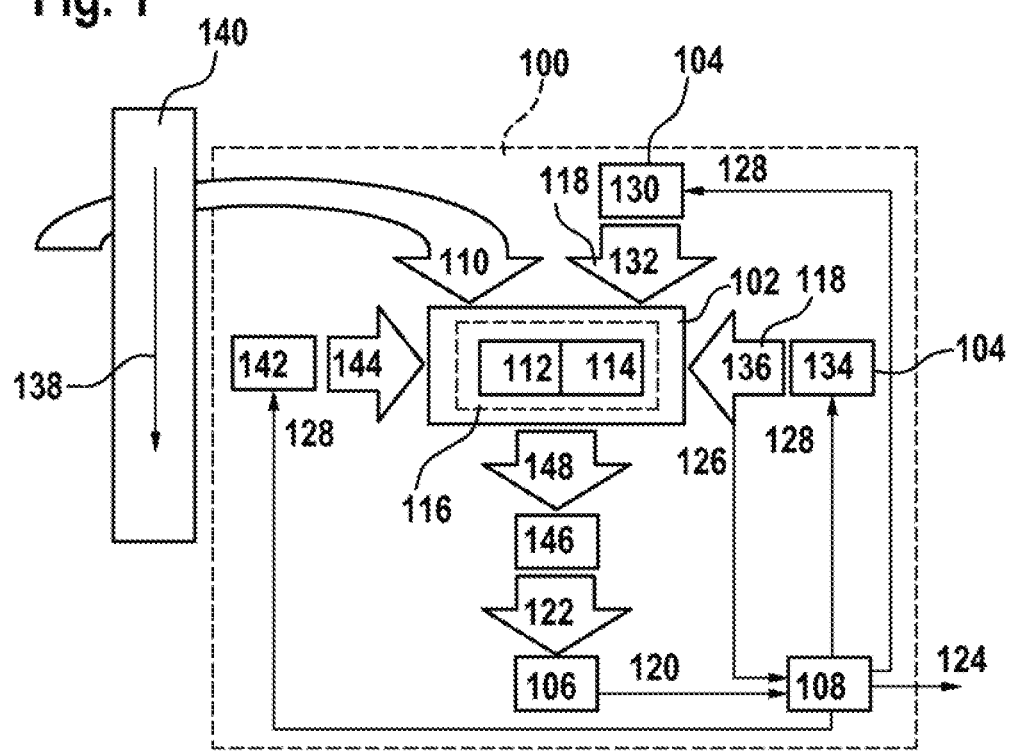
FIG. 1 shows a block diagram of a current sensor, according to one exemplary embodiment of the present disclosure.

In the following description of advantageous exemplary embodiments of the present disclosure, identical or similar reference numerals are used for the elements depicted in the various figures and acting similarly, a repeated description of these elements being omitted.

FIG. 1 shows a block diagram of a current sensor 100 according to one exemplary embodiment of the present disclosure. The current sensor 100 includes a diamond material 102, an emitter 104, a sensor 106, and an evaluating device 108. The magnetic field sensor 100 is configured to measure a magnetic field 110. To measure the magnetic field 110, the diamond material 102 is exposed to the magnetic field 110. The diamond material 102 has at least one nitrogen intercalation 112 and a vacancy 114 in the crystal lattice diamond material 102 which is adjacent to the nitrogen intercalation 112. Together, the nitrogen intercalation 112 and the vacancy 114 form a nitrogen-vacancy center 116 in the crystal lattice.

The emitter 104 is configured to provide electromagnetic waves 118 in order to excite the diamond material 102. The sensor 106 is configured to detect an intensity 120 of a fluorescence 122 of the diamond material 102.

The evaluating device 108 is configured to ascertain a field strength 124 of the magnetic field 110, using the fluorescence intensity 120 and a frequency 126 of the electromagnetic waves 118.

Using the field strength and the law of induction, an electric current intensity inducing the magnetic field 110 may be determined. The electric current intensity may be determined in a separate determination device or a determination device which is integrated into the current sensor 100.

In one exemplary embodiment, the evaluating device 108 is configured to control the emitter 104 in order to carry out the measurement of the magnetic field 110. For this purpose, the evaluating device 108 provides control signals 128.

Here, the emitter 104 has a light source 130 for providing electromagnetic waves 118 in the light spectrum, or light 132. Furthermore, the emitter 104 includes a microwave transmitter 134 for providing electromagnetic waves 118 in the microwave spectrum, or microwaves 136. The evaluating device 108 may control an intensity and/or the frequency 126 of the light source 130 and/or the microwave transmitter 134.

The magnetic field 110 results in particular via a current flow 138 in an electrical conductor 140. The current sensor 100 is arranged adjacent to the electrical conductor 140, so that the magnetic field 110 penetrates the diamond material 102 when the current 138 flows through the conductor 140.

In one exemplary embodiment, the current sensor 100 has a reference magnetic field source 142 for providing a reference magnetic field 144. By means of the reference magnetic field 144, the orientation and intensity of which are known, the diamond material 102 is excited to fluorescence in a known manner.

Since the diamond material 102 is excited by means of light 132 and microwaves 136, in one exemplary embodiment, the current sensor 100 has an optical filter 146 between the diamond material 102 and the sensor 106. Undesirable components of the light spectrum 148 coming from the diamond (for example, portions from the light emission 132 of the emitter 130) are filtered out of the fluorescence signal 148 by the filter 146, in order to maintain the fluorescence 122 and to be able to detect it with low interference.

The approach provided here provides a current sensor 100 having a high dynamic response in a single sensor element 102. The provided approach is based on the use of NV centers 116 in diamond 102. NV centers 116 in diamond respond in an extremely sensitive manner to external magnetic fields 110 and are based on the Zeeman effect, i.e., the splitting of quantized states in the NV center 116 of the diamond crystal 102. This splitting responds linearly to magnetic field change over a magnetic field strength range from nanotesla nT up to 1000 T.

By placing an NV sensor 100 on an electrical conductor 140, when current is flowing 138, the magnetic field changes 110 caused by the induction may be detected, and they may then be used to backward-calculate the current intensity 138 in the electrical conductor 140.

Under the approach provided here, NV centers 116 in diamond 102 are used for extremely precise and non-contact measurement of magnetic fields 110 induced by current 138. By means of backward calculation, the electric current intensity may be deduced using the law of induction.

The magnetic field 110 caused by induction in a current-carrying electrical conductor 140 at a distance r is calculated as follows:

$$B = \mu_0 \cdot \frac{I}{2\pi \cdot r}$$

using the magnetic field constant $\mu_0$ and the current I in the conductor 140.

Core elements of this sensor element 100 include the optical excitation via an integrated light emitter 130 (LED or VCSEL), a diamond crystal 102 provided with NV centers 116, a microwave strip antenna 134 in the immediate vicinity of the diamond membrane 102, an optical filter layer 146 for filtering the light spectrum 148 coming from the diamond (emission from the emitter 132 plus fluorescence 122), and an integrated photodiode 106 below the diamond membrane 102 which detects the fluorescence 122 of the NV centers 116. The advantage is first and foremost that the Zeemann splitting of the electronic states in the NV center 116, which forms the basis of the measuring principle, responds linearly to external magnetic fields 110 over an extremely large field strength range; therefore, the sensor 100 suitable in principle for precise measurement of electric currents 138 over an extremely large measuring range from mA to 1500 A.

Figure 2:
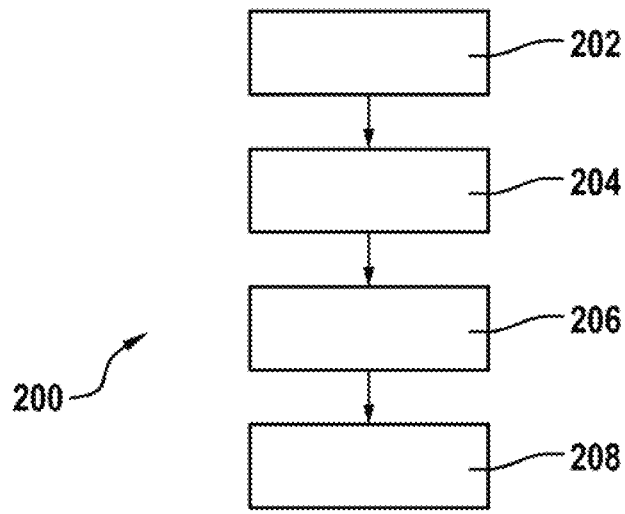
FIG. 2 shows a flow chart of a method for measuring a current, according to one exemplary embodiment of the present disclosure.

FIG. 2 shows a flow chart of a method 200 for measuring a current, according to one exemplary embodiment of the present disclosure. The method 200 may be carried out using a current sensor, as depicted, for example, in FIG. 1. The current sensor includes a diamond material having at least one nitrogen intercalation and a vacancy in the crystal lattice of the diamond material which is adjacent to the nitrogen intercalation. The diamond material is arranged such that it is penetrated by a magnetic field induced via an electric current flow in a conductor. The method 200 includes a step 202 of providing, a step 204 of detecting, and a step 206 of evaluating. In addition, the method 200 includes a step of determining 208. In step 202 of providing, electromagnetic waves are provided for exciting the diamond material. In step 204 of detecting, an intensity of a fluorescence of the diamond material is detected. In step 206 of evaluating, the fluorescence intensity and a frequency of the electromagnetic waves are evaluated in order to ascertain a magnetic field strength of the magnetic field. In the step of providing 208, the current flow in the conductor inducing the magnetic field is determined using the field strength and a processing specification. In this case, the processing specification reflects the geometric relationships between the conductor and the current sensor.

In step 202 of providing, in one exemplary embodiment, a reference magnetic field having a reference field strength and a reference field direction may be provided, in order to excite the diamond material to a reference fluorescence. In step 206 of evaluating, the field strength may furthermore be ascertained using the reference field strength and the reference field direction.

Figure 3:
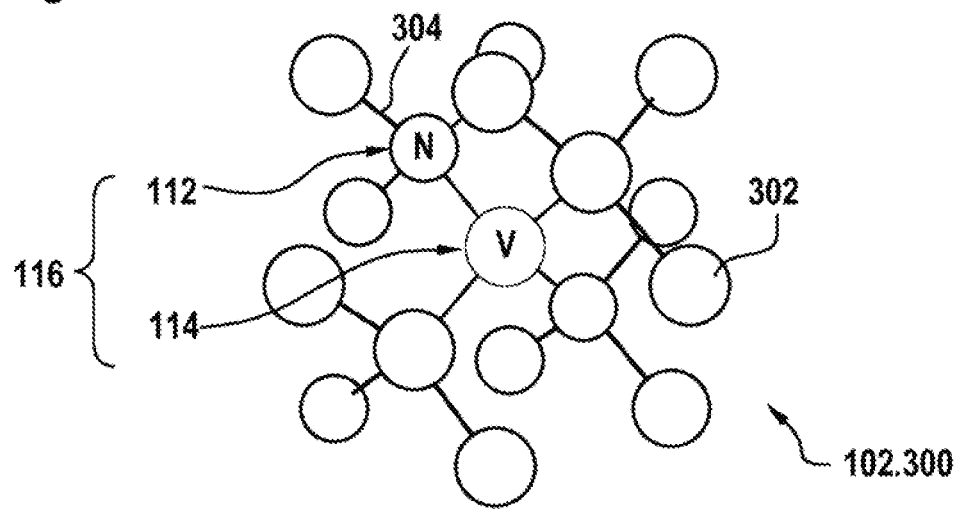
FIG. 3 shows a depiction of a diamond material having a nitrogen intercalation and a vacancy, according to one exemplary embodiment of the present disclosure.

FIG. 3 shows a depiction of a diamond material 102 having a nitrogen intercalation 112 and a vacancy 114, according to one exemplary embodiment of the present disclosure. The diamond material 102 essentially corresponds to the diamond material in FIG. 1. The diamond material 102 has a tetrahedral crystal structure 300 or a cubic crystal lattice 300 made up of carbon atoms 302. Each carbon atom 302 has four bonds 304 which are oriented at an angle of approximately 109.5 degrees with respect to one other.

The nitrogen intercalation 112 is made up of a nitrogen atom 112 which is intercalated into the crystal lattice 300 instead of a carbon atom 302. The nitrogen atom 112 has only three bonds 304 to carbon atoms 302. At the point at which the fourth carbon atom would be arranged, the vacancy 114 in the crystal lattice 300 is arranged directly adjacent to the nitrogen atom 112. The vacancy 114 thus corresponds to a gap in the crystal structure 300. The three carbon atoms 302 which are adjacent to the vacancy 114 each have a vacant or free bond.

In other words, FIG. 3 shows a nitrogen-vacancy center 116 in diamond 106. A carbon atom 302 has been replaced by a nitrogen atom 112; a directly adjacent carbon atom is absent in the diamond lattice 300, forming a vacancy 114.

Figure 4A:
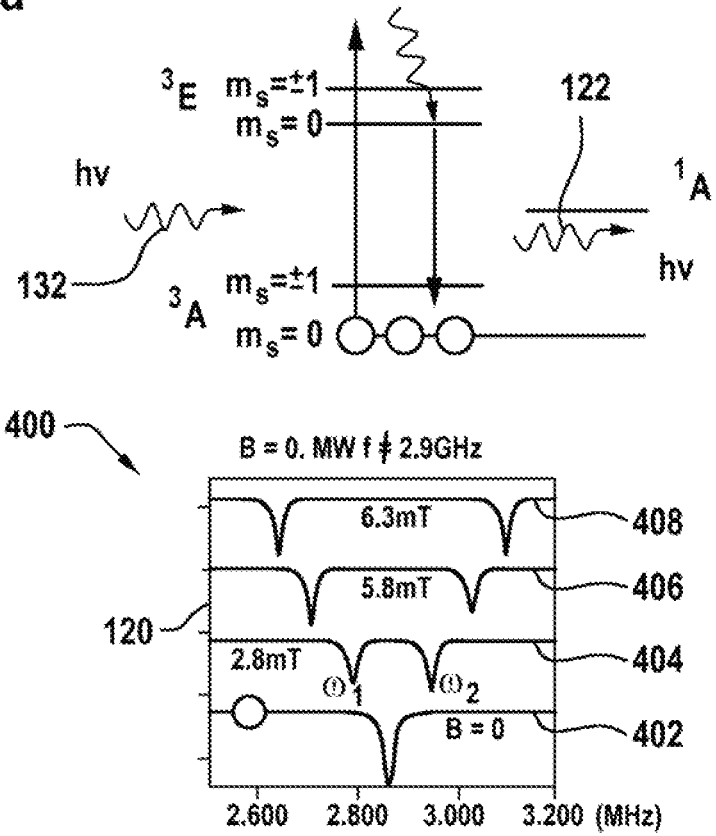

FIGS. 4a, 4b, and 4c show a functionality and energy diagram of the current measurement via fluorescence measurement in the case of additional microwave excitation 136, according to one exemplary embodiment of the present disclosure. The diamond material is simultaneously excited by means of light 132 and microwave energy 136. The functionality is depicted based on a multidimensional diagram 400. In the diagram, a frequency spectrum of the excitation frequency of the microwave excitation 136 is plotted on the abscissa. Frequencies between 2500 MHz and 3200 MHz are plotted. The intensity 120 of the fluorescence 122 is plotted on the ordinate. In the diagram, four profiles 402, 404, 406, 408 of the intensity 120 are depicted one above the other. The profiles 402, 404, 406, 408 represent the intensity 120 of the fluorescence 122 at four different field strengths of the magnetic field. A first profile 402 represents the fluorescence 120 over the frequency spectrum without a magnetic field. The first profile 402 has a local minimum at an excitation frequency of 2900 MHz. If the microwave frequency corresponds to the energy gap between the 3 A and ms+−1 levels, there is an onset of fluorescence. The second profile 404 represents the fluorescence 122 over the frequency spectrum at a magnetic field strength of 2.8 millitesla (mT). The second profile 404 has two local minima at ω1 and ω2. The third profile 406 represents the fluorescence 122 over the frequency spectrum at a magnetic field strength of 5.8 millitesla (mT). The third profile 406 also has two local minima. The frequency spacing between the minima of the third profile 406 is larger than that of the minima of the second profile 404. The fourth profile 408 represents the fluorescence 122 over the frequency spectrum at a magnetic field strength of 8.3 millitesla (mT). The fourth profile 408 also has two local minima which in turn have a frequency spacing which is larger than that of the minima of the third profile 406. If an external magnetic field is present, the ms+−1 level splits, and two defined microwave frequencies exist, in which the fluorescence 122 decreases. The frequency spacing is proportional to the magnetic field.

For evaluation, a first local intensity minimum at a first frequency of the electromagnetic waves 136 may be evaluated. Furthermore, a second local intensity minimum at a second frequency of the electromagnetic waves 136 may be evaluated. The field strength may be ascertained using a frequency spacing between the frequencies.

The intensity profiles 402, 404, 406, 408 of the fluorescence 122 may be detected if the electromagnetic waves 136 are provided as a frequency profile. The field strength may be ascertained via the relationship between the frequency profile and the intensity profiles 402, 404, 406, 408.

NV centers in diamond have the energy spectrum shown in FIG. 4. In the normal state without microwave energy 136 and without a B-field, the NV center exhibits fluorescence 122 in the red wavelength range under optical excitation 132. If microwave radiation 136 is irradiated in addition to the optical excitation 132, there is an onset of the fluorescence 122 at 2.88 GHz, since in this case, the electrons are raised from the m+−1 level of the 3 A state to the m+−1 level of the 3E state, and recombine from there in a non-radiating manner. In the case of an external magnetic field, splitting of the m+−1 level occurs (Zeeman splitting), and if the fluorescence 122 is plotted over the frequency of the microwave excitation 136, two dips appear in the fluorescence spectrum 404, 406, 408, the frequency spacing of which is proportional to the magnetic field strength. In this case, the magnetic field sensitivity is defined by the minimally resolvable frequency shift, and may reach up to 100 pT/√Hz.

Figure 5:
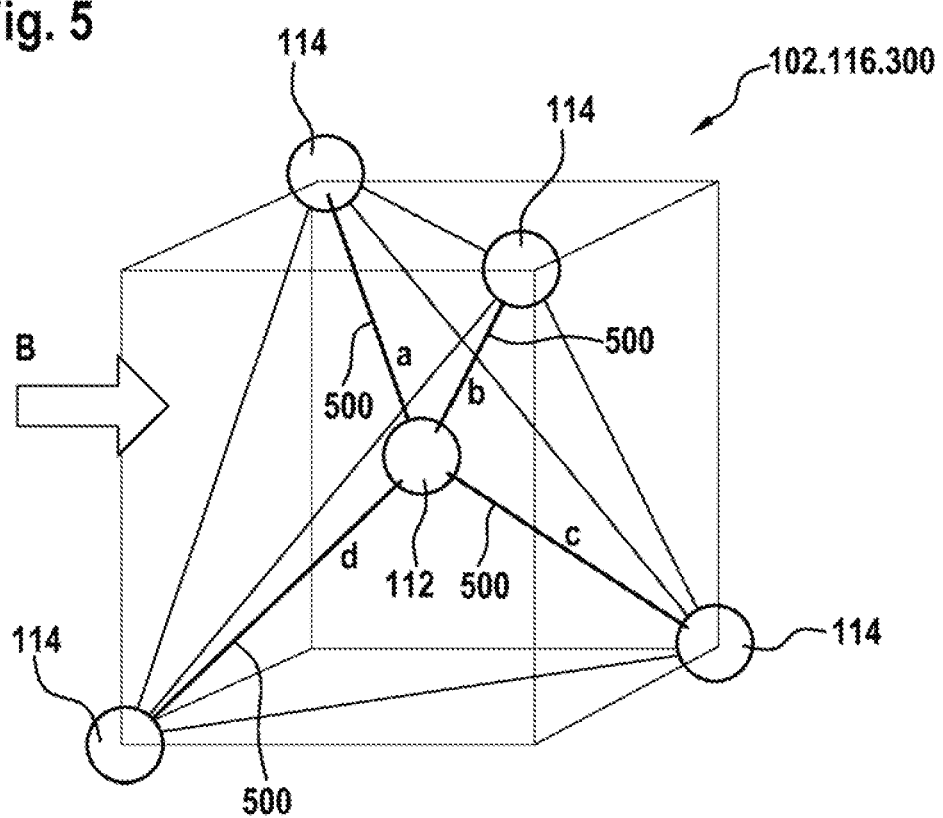
FIG. 5 shows a depiction of the possible locations of a vacancy in the crystal structure of a diamond material, according to one exemplary embodiment of the present disclosure.

FIG. 5 shows a depiction of the possible locations of a vacancy 114 in the crystal structure 300 of a diamond material 102, according to one exemplary embodiment of the present disclosure. Here, all four possibilities of how the vacancy 114 may be arranged with respect to the nitrogen atom 112 are depicted simultaneously. Only one of the four locations is possible in a respective nitrogen vacancy center 116.

Figure 6:
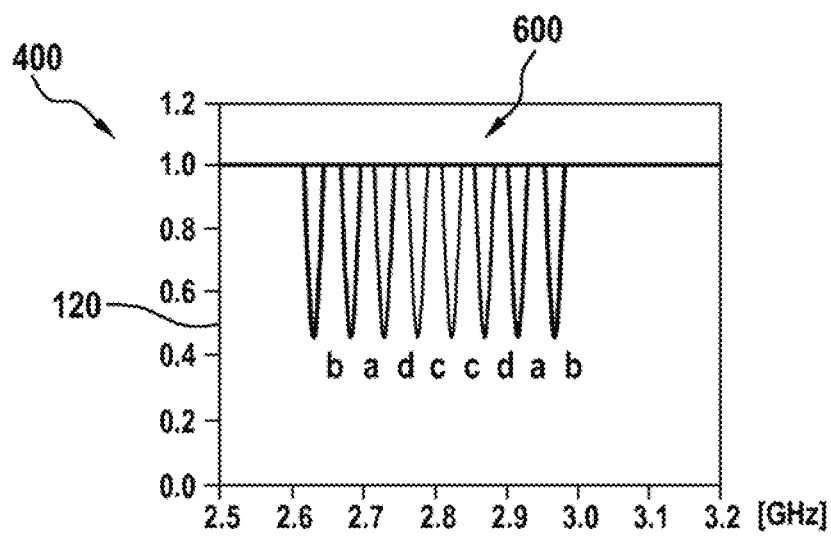
FIG. 6 shows local intensity minima as a function of the location of a vacancy in the crystal structure of a diamond material, according to one exemplary embodiment of the present disclosure.

In other words, FIG. 5 shows a crystal unit cell 300 of diamond 102. In this unit cell 300, the NV center 116 has four possibilities for being arranged in the crystal. Since the angle between the magnetic field direction B and the crystal axis 500 is different for each crystal axis 500, the magnitude of the frequency splits in the NV centers 116 varies, depending on the particular crystal direction. This results in up to four related pairs of fluorescence dips in the fluorescence spectrum, as depicted in FIG. 6. By evaluating the frequency spacings for each crystal direction, the magnetic field direction and intensity may be extrapolated.

Since the NV center 116 in the single-crystal diamond 102 has four possibilities for being arranged in the crystal lattice 300, if a directed magnetic field is present, the NV centers 116 present in the crystal 300 respond at differing levels to the external magnetic field, depending on the location in the crystal 300. As a result, a maximum of four interrelated pairs of fluorescence minima may appear in the spectrum, the shape of said pairs and their location with respect to one other making it possible to unambiguously determine the magnitude and direction of the magnetic field.

FIG. 6 shows local intensity minima 600 as a function of the location of a vacancy in the crystal structure of a diamond material, according to one exemplary embodiment of the present disclosure. As in FIG. 4, the intensity minima 600 are plotted in a diagram 400 which plots the frequency spectrum of the excitation frequency on the abscissa and the intensity 120 of the fluorescence on the ordinate. The intensity minima 600 correspond to the corresponding crystal axes in FIG. 5.

This property may be used in the provided current sensor to differentiate the fields induced via the electric current, which form radially around the current-carrying conductor and the direction of which is thus known, from external stray fields.

FIG. 7 shows a depiction of a current sensor 100 according to one exemplary embodiment of the present disclosure. The current sensor essentially corresponds to the current sensor in FIG. 1. In this exemplary embodiment, the current sensor 100 is designed as a monolithically integrated magnetic sensor 100 for non-contact current measurement. The light source 130 is bonded to a Si photodiode 106 in the form of an LED or VCSEL laser chip. An optical filter 146 is present on the photodiode 106 for filtering the excitation light 132; on it is the diamond layer 102 containing NV centers 116. An RF strip antenna 132 is present on the edge of the photodiode 106 for coupling in the microwave radiation.

In other words, FIG. 7 shows a current sensor 100 based on NV centers in diamond 102.

For many applications, the precise measurement of electric current is an indispensable component in electrical systems and facilities. Examples of this include the measurement of the electric power in electricity meters or photovoltaic inverters for the precise calculation of the power drawn or fed into the grid, battery management in electric and hybrid vehicles, or solar battery banks. Finally, current measurement devices are also used for detecting current peaks and for corresponding electrical protection systems.

Previous approaches include current sensors based on the Hall effect, fluxgate sensors, or simple filament fuses or circuit breakers for applications or protection from overvoltage or current. For the load requirements in electric or hybrid vehicles, Hall sensors or fluxgate transducers may not have enough dynamic response to be able to reliably measure currents from mA up to 1500 amperes. Under the approach using voltage measurements at shunt resistors in the micro-ohm range, which has been used up to now for this case, very small currents provide only a very small voltage signal; thus, their measurement accuracy is limited.

The current sensor 100 shown here is particularly suitable for battery management in the automobile, since it is able to reliably detect the electric current over six orders of magnitude, in a range from, for example, 1 mA to 1500 A.

One possible implementation of a monolithically integrated sensor element 100 based on an NV-infused diamond crystal 102 is depicted. An LED structure or a VCSEL is possible as a light source 130. For monolithic integration, it is expedient to bond the LED or VCSEL chip 130 or wafer, which is typically made up of a III/V semiconductor material via chip-to-wafer or chip-to-chip bonding methods, to the Si wafer, which contains the additional necessary sensor elements: diamond layer 102, optical filter 146, photodiode 106, and RF antenna 132. For manufacturing the latter components, it is suitable first to structure the photodiode 106 into the Si wafer. Said photodiode is made up of p- and n-doped regions which, for example, may be structured via ion implantation using shadow masks. An optical filter layer 146 is then applied to the photodiode 106.

Possible embodiments would include, for example, dielectric filters, microcavities with semitransparent metal mirrors, dye filters, or plasmonic filters. The NV-doped diamond layer 102 may then be bonded onto the Si wafer as a separately manufactured component. Alternatively, the integrated CVD deposition of a diamond layer 102 is also possible. The microwave antenna 132 may then be embodied as a metallic strip conductor on the Si wafer.

In order to facilitate the evaluation of the current-induced magnetic fields, it may be advantageous to integrate a reference magnetic field into the sensor element 100. This may, for example, be generated via a current-carrying coil which can be fabricated using thin-layer metallization technology, or via permanent magnetic materials.

Figure 8A:
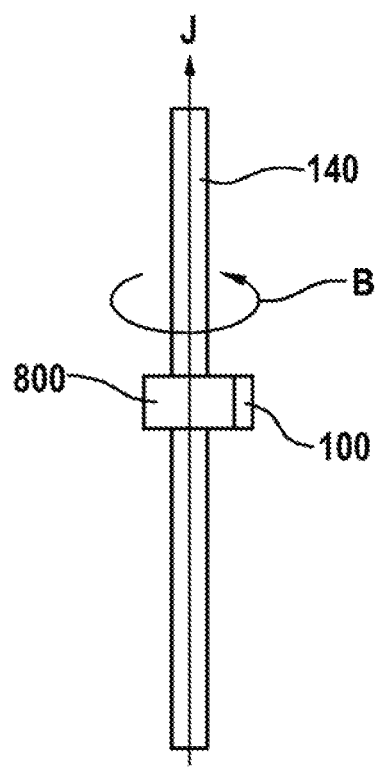
FIGS. 8a, 8b show installation examples of current sensors, according to exemplary embodiments of the present disclosure.
Figure 8B:
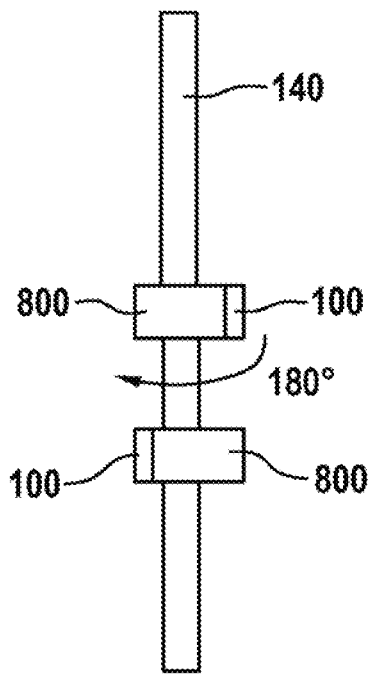

FIGS. 8a and 8b show installation examples of current sensors 100 according to exemplary embodiments of the present disclosure. In FIG. 8a, a single current sensor 100 is attached to an electrical conductor 140 via a mechanical support 800. In FIG. 8b, two similar current sensors 100 are attached to the same electrical conductor 140 via mechanical supports 800. The current sensors arranged rotated by 180 degrees with respect to one other.

In other words, FIGS. 8a and 8b show the placement of NV sensors 100 on an electrical conductor 140. The sensor chip 100 based on NV centers may, for example, be glued to a mechanical support 800, which may be fastened to the conductor 140. The mechanical support 800 is designed in such a way that it always ensures the same distance between the conductor 140 and the sensor element 100, since the magnetic field to be measured is highly dependent on the distance r from the conductor 140. In order to minimize stray field influences, it may be advantageous to use two sensor elements 100 having an angular offset of, for example, 90 degrees.

Using the field strength and the law of induction, the current inducing the magnetic field may be determined.

In order to further minimize the interference field influences on the measuring signal, the possibility exists to attach a second sensor element 100 to the electrical conductor 140 in the immediate vicinity of the first sensor element 100, said sensor element, however, being offset radially by 180 degrees on the electrical conductor 140. Thus, those interference fields which coincidentally also run in a radial direction at the installation position of the first sensor element 100 may be filtered out. By averaging the absolute magnetic fields of the two sensor elements 100, the interference field may be factored out.

Figure 9B:
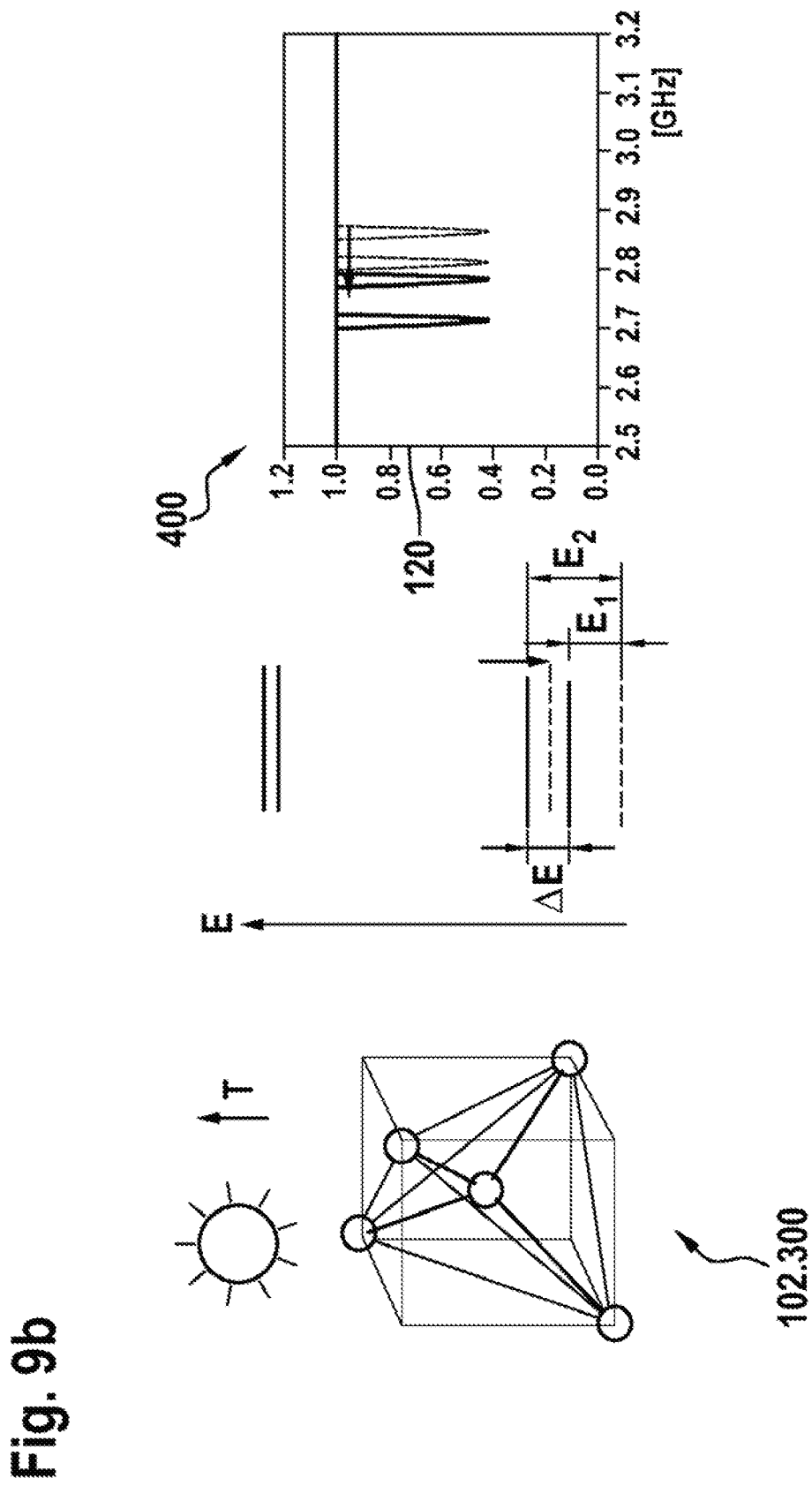

FIGS. 9a and 9b show a functionality and energy diagram of the temperature measurement via fluorescence measurement in the case of additional microwave excitation, according to one exemplary embodiment of the present disclosure. In FIG. 9a, the crystal lattice 300 of the diamond material 102 at low temperature or room temperature is depicted. In FIG. 9b, the crystal lattice 300 at increased temperature is depicted. The temperature difference results in a size difference of the diamond material between the two temperatures.

The energy diagram and the diagram 400 is next to the crystal lattice 300 in each case; as in FIGS. 4 and 6, the diagram 400 shows the intensity 120 of the fluorescence over the frequency spectrum of the excitation. If the crystal lattice 300 expands, the local minima shift to lower frequencies. As a result, the temperature of the diamond material 102 may be calculated from the frequencies of the minima.

In other words, FIG. 9 shows a temperature measurement via NV centers. In the case of temperature change, here, a temperature increase between FIGS. 9a and 9b, the crystal 300 expands isotropically and the fluorescence dips occurring in the fluorescence spectrum shift simultaneously to lower frequencies for all crystal axes. For purposes of simplification, this is shown only for one crystal axis. The splitting via an external magnetic field is maintained and is not influenced by the temperature change.

The temperature at the sensor element 102 may be detected using additional evaluation algorithms. In the case of a temperature increase, a volumetric expansion of the diamond crystal 102 occurs. As a result, the energy gap between the lowest energy level and the center of energy mass of the m−1 and m+1 levels of the NV center decreases, coinciding with a uniform frequency shift of related fluorescence minima. This isotropic shift does not influence the magnitude of the Zeemann splitting, enabling the determination of the temperature independently of the magnetic field. The additional temperature measurement at the installation position of the current sensor may be used in a variety of ways.

For example, the temperature measurement may be used as a plausibility check of the measured current value, by measuring the induced magnetic field and measuring the warming of the electrical conductor caused by ohmic losses, which are also proportional to the current intensity.

The temperature measurement may also be used for monitoring the temperature of the battery, if the sensor is directly attached to the battery contact of the battery.

Finally, the temperature measurement may be used to provide a warning of cable fire.

The exemplary embodiments described and shown in the figures are selected only by way of example. Different exemplary embodiments may be combined completely or with respect to individual features. One exemplary embodiment may also be supplemented by features of an additional exemplary embodiment. Furthermore, the method steps provided here may be repeated and carried out in a sequence which is different from the one described.

If an exemplary embodiment includes an "and/or" link between a first feature and a second feature, this is to be read as meaning that the exemplary embodiment has both the first feature and the second feature according to one specific embodiment, and has either only the first feature or only the second feature according to an additional specific embodiment.

The invention claimed is:

1. A method for measuring an electric current producing a magnetic field, using a diamond material which is exposed to the magnetic field, the diamond material having at least one nitrogen intercalation and a vacancy in a crystal lattice of the diamond material which is adjacent to the nitrogen intercalation, the method comprising:
   exciting the diamond material to fluoresce by providing first electromagnetic waves in a first frequency spectrum and second electromagnetic waves in a second frequency spectrum;
   detecting a fluorescence intensity of the fluorescence;
   ascertaining a magnetic field strength of the magnetic field influencing the fluorescence by evaluating the fluorescence intensity and a frequency of the second electromagnetic waves the ascertaining of the magnetic field strength comprising:
      evaluating a first local intensity minimum of the fluorescence at a first frequency of the second electromagnetic waves;
      evaluating a second local intensity minimum of the fluorescence at a second frequency of the second electromagnetic waves; and
      ascertaining the magnetic field strength based on a frequency spacing between the first and second frequencies; and determining a current intensity of the electric current based on the magnetic field strength.

2. The method as claimed in claim 1, wherein:
the exciting of the diamond material further comprises irradiating the second electromagnetic waves as a frequency profile;
the detecting of the fluorescence intensity further comprises detecting an intensity profile of the fluorescence; and
the ascertaining of the magnetic field strength further comprises ascertaining the magnetic field strength based on a relationship between the frequency profile and the intensity profile.

3. The method as claimed in claim 1, the exciting of the diamond material further comprising:
exciting the diamond material using light and microwave energy.

4. The method as claimed in claim 1, wherein:
the exciting of the diamond material further comprises exciting the diamond material to a reference fluorescence by providing a reference magnetic field having a reference field strength and a reference field direction; and
the ascertaining of the magnetic field strength further comprises ascertaining the magnetic field strength based on the reference field strength and the reference field direction.

5. The method as claimed in claim 1 further comprising:
maintaining the fluorescence by filtering an emission of the diamond material.

6. The method as claimed in claim 1 further comprising:
ascertaining a temperature of the diamond material based on a frequency shift of local minima of the fluorescence intensity.

7. A current sensor for measuring an electric current producing a magnetic field, the current sensor comprising:
a diamond material which is exposed to the magnetic field, the diamond material having at least one nitrogen intercalation and a vacancy in a crystal lattice of the diamond material which is adjacent to the nitrogen intercalation;
an emitter configured to excite the diamond material to fluorescence by providing first electromagnetic waves in a first frequency spectrum and second electromagnetic waves in a second frequency spectrum, the second electromagnetic waves being irradiated as a frequency profile;
a sensor configured to detect a fluorescence intensity profile of the fluorescence;
an evaluating device configured to ascertain a magnetic field strength of the magnetic field based on a relationship between the frequency profile and the fluorescence intensity profile; and
a determining device configured to determine a current intensity of the electric current based on the magnetic field strength.

8. A non-transitory computer program for measuring an electric current producing a magnetic field, using a diamond material which is exposed to the magnetic field, the diamond material having at least one nitrogen intercalation and a vacancy in a crystal lattice of the diamond material which is adjacent to the nitrogen intercalation, the computer program being configured to at least one of carry out, implement, and control:
excitation of the diamond material to fluorescence by providing first electromagnetic waves in a first frequency spectrum and second electromagnetic waves in a second frequency spectrum;
detection of a fluorescence intensity of the fluorescence;
ascertainment a magnetic field strength of the magnetic field influencing the fluorescence by evaluating the fluorescence intensity and a frequency of the second electromagnetic waves, the ascertainment of the magnetic field strength comprising:
evaluation a first local intensity minimum of the fluorescence at a first frequency of the second electromagnetic waves;
evaluation a second local intensity minimum of the fluorescence at a second frequency of the second electromagnetic waves; and
ascertainment the magnetic field strength based on a frequency spacing between the first and second frequencies; and
determination of a current intensity of the electric current based on the magnetic field strength.

9. The non-transitory computer program according to claim 8, wherein the computer program is stored on a machine-readable storage medium.

* * * * *